United States Patent
Nowka

(10) Patent No.: US 6,570,408 B2
(45) Date of Patent: May 27, 2003

(54) CHARGE RECOVERY FOR DYNAMIC CIRCUITS

(75) Inventor: Kevin John Nowka, Round Rock, TX (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/931,304

(22) Filed: Aug. 16, 2001

(65) Prior Publication Data

US 2003/0034801 A1 Feb. 20, 2003

(51) Int. Cl.[7] .............................................. H03K 19/096
(52) U.S. Cl. .............................. 326/95; 326/88; 327/589
(58) Field of Search ................................. 326/95–98, 88, 326/92; 327/390, 589

(56) References Cited

U.S. PATENT DOCUMENTS 5,642,061 A * 6/1997 Gorny ........................... 326/97
5,859,548 A * 1/1999 Kong ........................... 326/113
5,910,735 A * 6/1999 Allen ............................ 326/93
6,373,290 B1 * 4/2002 Forbes ........................... 326/96

\* cited by examiner

Primary Examiner—Michael Tokar
Assistant Examiner—James H Cho
(74) Attorney, Agent, or Firm—Anthony V. S. England; Casimer K. Salys

(57) ABSTRACT

In one aspect, a method for charge recovery in dynamic circuitry includes discharging a dynamic node during an evaluation interval by input circuitry coupled to the dynamic node responsive to one or more input signals. The discharging includes transferring the charge from the dynamic node to a capacitor during the evaluation time interval. The dynamic node is charged during a precharge interval by a voltage source and precharge timing circuitry coupled to the dynamic node responsive to a precharge signal. The charging includes transferring the charge from the capacitor back to the dynamic node.

18 Claims, 5 Drawing Sheets

CHARGE RECOVERY FOR DYNAMIC CIRCUITS

BACKGROUND OF THE INVENTION

1. Field of the Invention

The present invention relates to dynamic logic circuits, and more particularly to dynamic logic circuits having circuitry for reduced power consumption.

2. Related Art

Due to its speed, it is well known to use dynamic circuitry for high-performance applications. FIG. 1 illustrates a prototypical prior art dynamic logic circuit 100. The circuit 100 has a dynamic node 150 which is precharged to a high voltage during a precharge phase timed by clock 115. Then during an evaluation phase, also timed by clock 115, the dynamic node 150 may be selectively pulled down to a low voltage through input circuitry 122, depending on the state of the inputs.

More specifically, during the phase of clock 115 when the clock signal is low, PFET 101 in timing circuitry 120 is turned on and NFET 108 is turned off, which pulls dynamic node 150 up to Vdd. Then during the evaluation phase, that is, during the phase of clock 115 when the clock signal is high, PFET 101 is turned off and NFET 108 is turned on, so that the dynamic node 150 may be selectively pulled down to a low voltage through the NFET's 110 through 107 of input circuitry 122, depending on the state of the inputs on the gates 110 through 113.

The dynamic circuit 100 of FIG. 1 is a "domino" type of dynamic circuit, which includes an output stage, output circuitry 124 that enables chaining a number of dynamic circuits in series, or series-parallel combinations. That is, output circuitry 124 is a static gate which converts the state of the dynamic node 150 so that when the dynamic node 150 is in the precharged state the output signal on node 114 is low. Thus, even if the foot FET 108 is omitted in the next stage, the output 114 may be an input to a next dynamic logic circuit in a series without interfering in the precharging of the dynamic node in the next dynamic logic circuit.

The dynamic circuit 100 also has keeper circuitry 126 coupled to the output 114, Vdd, and the dynamic node 150 for keeping the dynamic node at the precharged state during the evaluation phase despite leakage through the input circuitry 122 and the foot device 108 if none of the inputs are active.

Conventionally, dynamic logic circuits have not been as widely used as have static logic circuits in applications requiring low-power consumption. However, there is a current trend requiring higher performance for embedded processors in applications such as personal digital assistants, cell phones, electronic books, watches, etc. This is particularly brought on by the demand for rendering of images by such devices, such as for Internet browsers. The embedded processors in these applications are frequently battery powered, so there is an increasing need for reduced power consumption in dynamic logic circuits.

SUMMARY OF THE INVENTION

The foregoing need is addressed in the present invention, according to which a dynamic circuit includes charge recovery circuitry for controlling the circuitry to reduce power consumption.

More particularly, the dynamic circuit includes a dynamic node and precharge timing circuitry coupled to the dynamic node and to a voltage source for driving the node to a high voltage state during a precharge interval responsive to a precharge signal. The dynamic circuit also includes input circuitry coupled to the dynamic node for selectively discharging the dynamic node to a low voltage state during an evaluation interval responsive to one or more input signals. Charge recovery circuitry of the dynamic circuit has a capacitor and circuitry for controlling transfer of charge from the dynamic node to the capacitor during the evaluation time interval and from the capacitor back to the dynamic node during the pre charge time interval.

In a method form, a method for charge recovery in dynamic circuitry includes discharging a charge from a dynamic node during an evaluation interval by input circuitry coupled to the dynamic node responsive to one or more input signals. The discharging includes transferring the charge from the dynamic node to a capacitor during the evaluation time interval. Then, during a precharge interval the dynamic node is charged to a higher voltage state by precharge timing circuitry coupled to the dynamic node and to a voltage source responsive to a precharge signal. The charging includes transferring the charge from the capacitor to the dynamic node during the precharge interval.

In an alternative method form, the method includes discharging a charge from a dynamic node of a first dynamic circuit during an evaluation interval by input circuitry for the dynamic circuit. The discharging includes transferring the charge from the dynamic node of the first dynamic circuit, by charge recovery circuitry, to a dynamic node of a predecessor dynamic circuit during the evaluation time interval of the first dynamic circuit. The dynamic node of the first dynamic circuit is charged to a higher voltage state during a precharge interval of the first dynamic circuit by precharge timing circuitry for the first dynamic circuit. The charging includes transferring charge from the dynamic node of the a successor dynamic circuit to the dynamic node of the first dynamic circuit during the precharge interval for the first dynamic circuit.

The present invention is advantageous because by recovering charge in the circuitry power consumption is reduced. Other objects and advantages of the invention will become apparent upon reading the following detailed description and upon reference to the accompanying drawings.

DETAILED DESCRIPTION OF A PREFERRED EMBODIMENT

The claims at the end of this application set out novel features which applicants believe are characteristic of the invention. The invention, a preferred mode of use, further objectives and advantages, will best be understood by reference to the following detailed description of an illustrative embodiment read in conjunction with the accompanying drawings.

Figure 1:
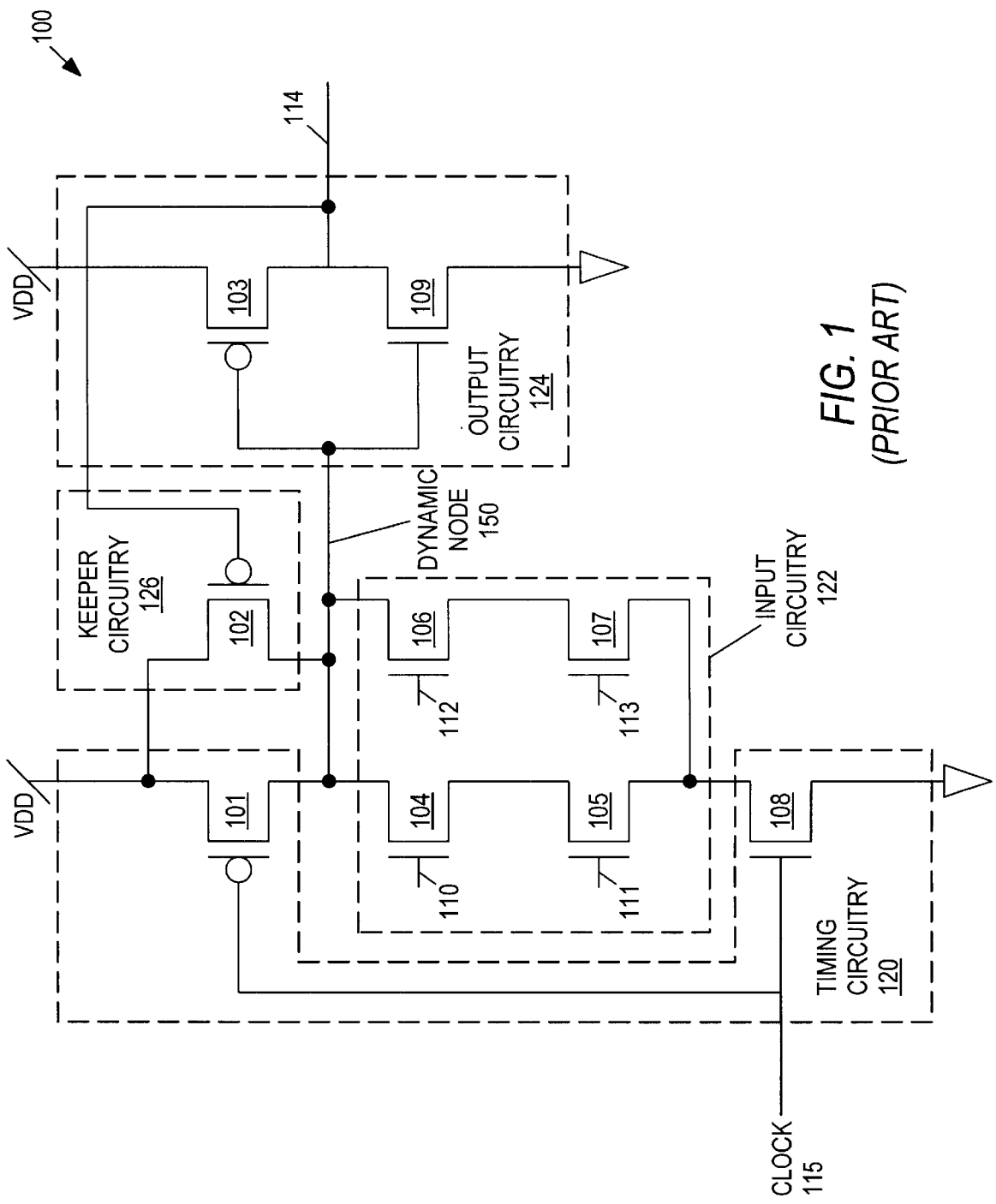
FIG. 1 illustrates a prototypical prior art dynamic logic circuit.
Figure 2:
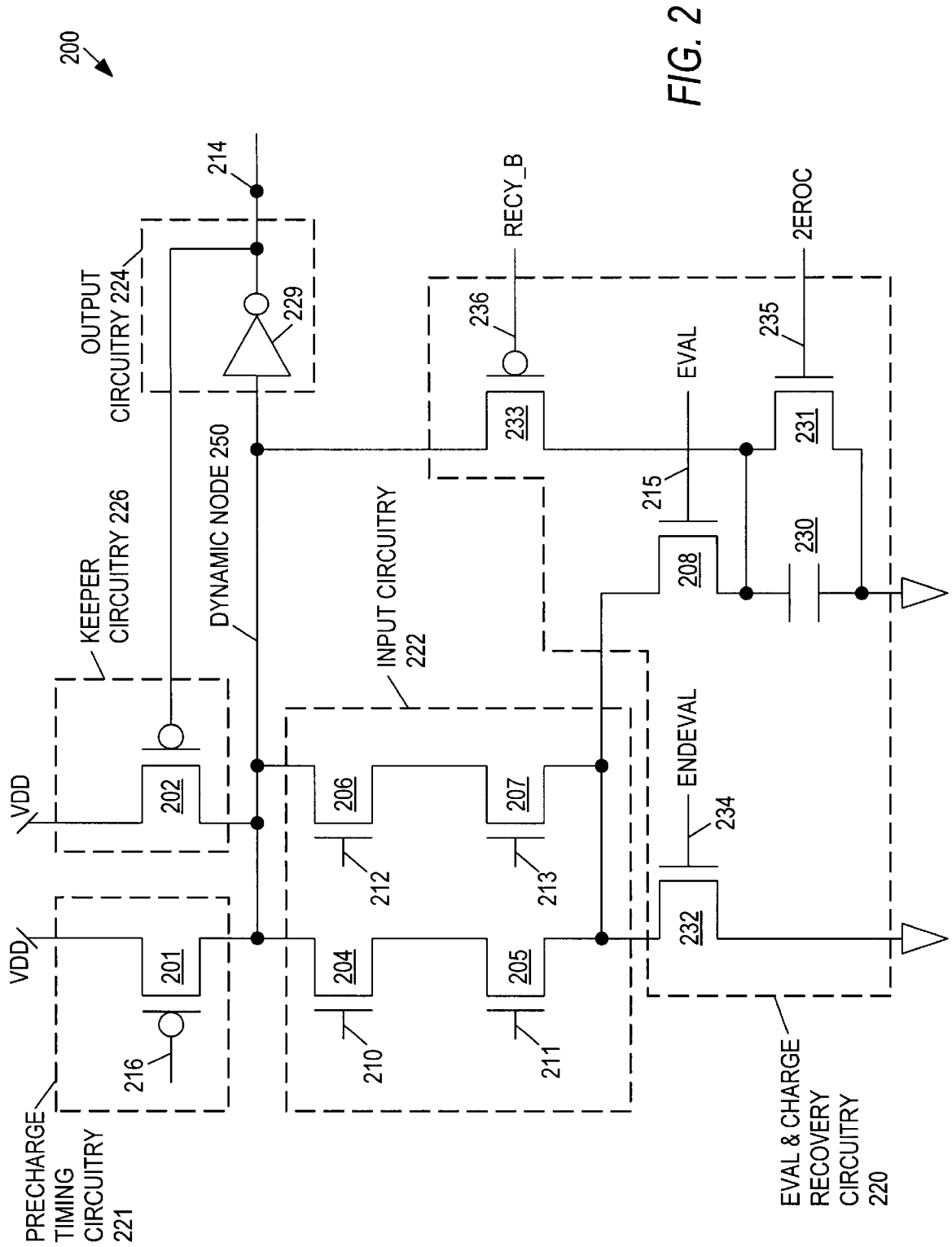
FIG. 2 illustrates a dynamic logic circuit, according to an embodiment of the present invention.

Referring now to FIG. 2, a dynamic logic circuit 200 is illustrated, according to an embodiment of the present invention. The circuit 200 has a dynamic node 250 which is directly coupled to precharge circuitry 221, keeper circuitry 226, output circuitry 224, input circuitry 222 and evaluation and charge recovery circuitry 220. The precharge circuitry 221, keeper circuitry 226, and output circuitry 224 are each also coupled directly to Vdd. Keeper circuitry 226 is also coupled directly to the output 214 of output circuitry 224. The input circuitry 222 is also directly coupled to evaluation and charge recovery circuitry 220, which in turn is coupled to ground. That is, the evaluation in charge recovery circuitry 220 is interposed between the input circuitry 222 and ground.

Figure 3:
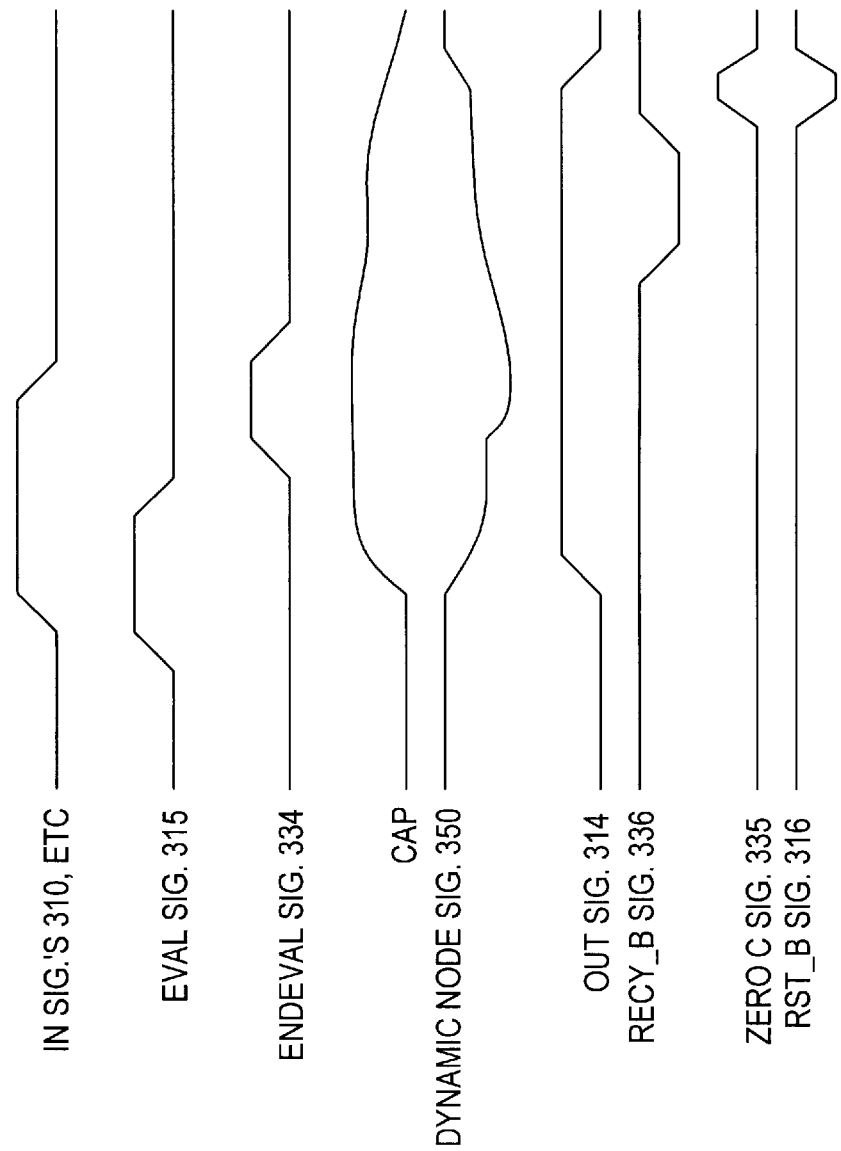
FIG. 3 illustrates timing of the operation of circuitry, according to an embodiment of the invention.

Referring now to FIG. 3, and referring also to the circuitry 200 of FIG. 2, timing is shown for a cycle of circuitry 200. The evaluate phase of operation is initiated by asserting eval signal 315, which is applied to the gate 215 of NFET 208 of evaluation and charge recovery circuitry 220. This turns on NFET 208. Then, input signals applied to gates 210 through 213 will have an effect. (It should be understood that in another embodiment the NFET 208 and evaluation signal 315 are omitted, and timing of the input signals 310, etc. permits the input circuitry 222 to perform the function of NFET 208, including insuring that the dynamic node 250 is isolated from ground during the precharge stage.) In the illustrated instance, the input signals 310, etc. are a certain combination which cause the dynamic node signal 350 to begin being pulled low, through NFET 208 and capacitor 230 and the certain combination of input circuitry 222 NFET's, such as NFET's 204 and 205. This in turn causes the output signal 314 to be pulled high at node 214 by action of inverter 229 of the output circuitry 224, and so on.

Next, the evaluation signal 315, applied to the gate 215, is deasserted, turning off NFET 208. The endeval signal 334, applied to the gate 234 is also asserted, turning on NFET 232. This discharges the signal 350 on the dynamic node 250 more directly to ground, that is, through NFET 232 rather than through capacitor 230. Next, at the evaluation phase ends with the end evaluation signal 315 and the input signals 310, etc. being de asserted.

Then the precharge phase is begun when the recycle signal 336, applied to the gate 236, is de asserted, turning on PFET 233, which dumps charge from the capacitor 230 back to the dynamic node 250, thereby driving the signal 350 at least partially back to Vdd. It should be understood that this recycle operation is only necessary if the dynamic node signal 350 has been discharged during the evaluation stage, because otherwise there would have been no charge transfer to the capacitor 230 during evaluation and there will be no substantial charge on the capacitor 230 to recover. Therefore, in an embodiment the recycle signal 336 is only the asserted on the condition that the dynamic node signal 350 was discharged.

Next, the recycle signal 336 is reasserted, turning off PFET 233. Then, to complete the precharge phase, the reset signal 316, applied to the gate 216, is deasserted, turning on PFET 201, which completes the driving of the dynamic node signal 350 on node 250 to Vdd. At the same time, the zero capacitor signal 335, applied to the gate 235, is asserted, turning on NFET 231, which shorts the anode of capacitor 230 to ground, thereby insuring that the capacitor 230 is fully discharged.

The amount of charge recovered by the capacitor 230 returning charge to the dynamic node 230 depends upon the size of the capacitor relative to the size of the capacitance of the circuitry connected to the dynamic node, and upon timing, such as timing of the evaluation signal 315 and the recycle signal 336. For example, if the capacitance of capacitor 230 is five times that of the dynamic node 250 then a maximum of about 14% of the charge is recoverable. If the capacitance of capacitor 230 is the same as that of the dynamic node 250 then a maximum of about 25% of the charge is recoverable. Charge recovery considerations thus suggest that a relatively small capacitor 230 is best. However, increasing the capacitance of capacitor 230 relative to that of the dynamic node 250 increases noise margin and speed of operation of the circuit 250. Therefore, it is generally preferred that the capacitor 230 be relatively large in comparison to the dynamic node 250 capacitance, and there is all the more need to discharge the capacitor by NFET 231 at the end of the precharge phase.

Figure 4:
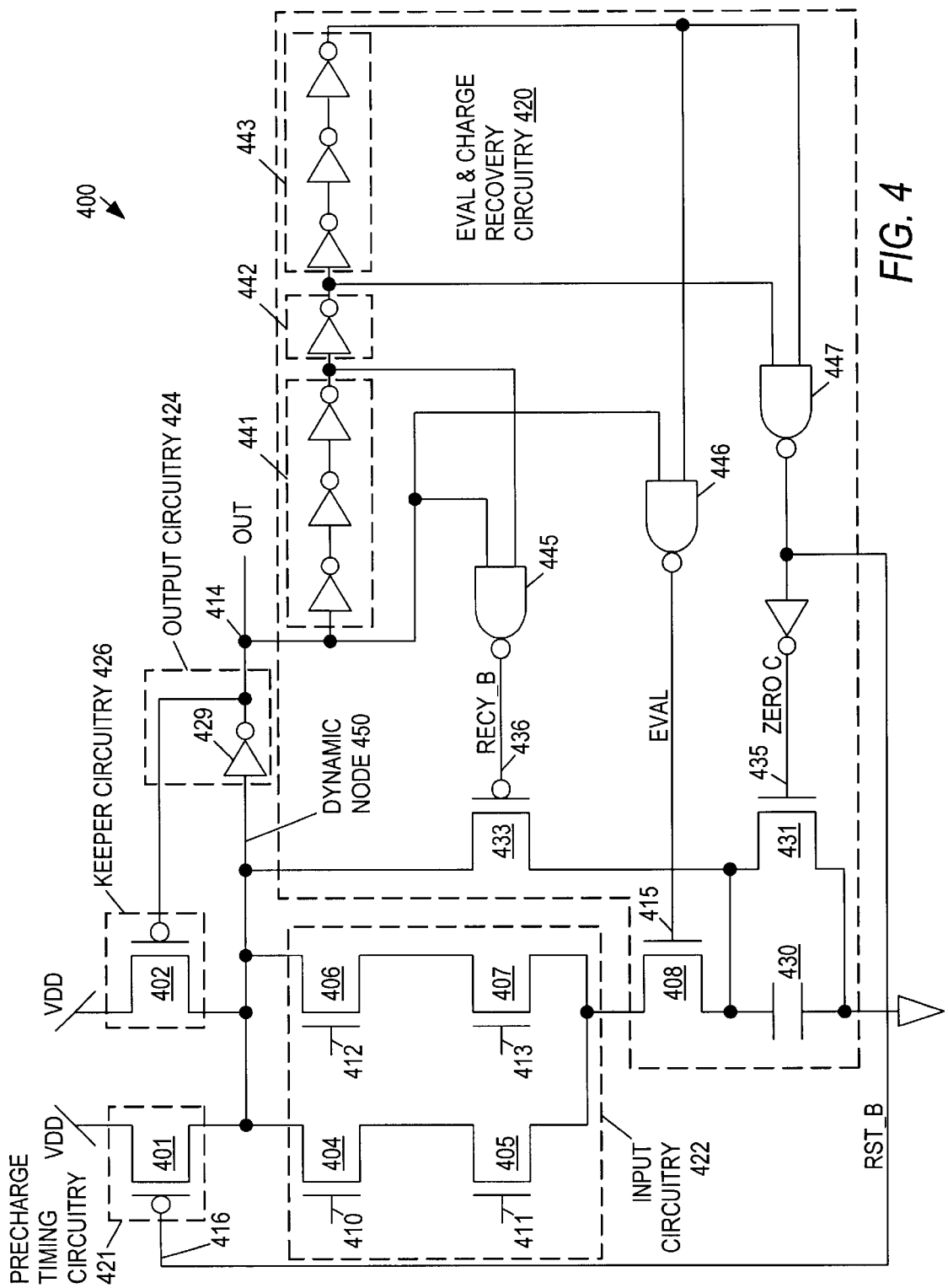
FIG. 4 illustrates a self-timed dynamic logic circuit, according to an embodiment of the present invention.

Referring now to FIG. 4, self-resetting dynamic circuitry 400 is illustrated, according to an embodiment. The circuit 400 has a dynamic node 450 which is directly coupled to precharge circuitry 421, keeper circuitry 426, output circuitry 424, input circuitry 422 and evaluation and charge recovery circuitry 420. The precharge circuitry 421, keeper circuitry 426, and output circuitry 424 are each also coupled directly to Vdd. Keeper circuitry 426 is also coupled directly to the output 414 of output circuitry 424. The circuitry 400 includes evaluation and charge recovery circuitry 420 coupled to the dynamic node 450, the output node 414, the input circuitry 422 and ground. The evaluation and charge recovery circuitry 420 is interposed between the input circuitry 422 and ground, and includes first, second and third time delay circuits 441 through 443. Besides performing a time delay function, each of the time delay circuits also invert their respective inputs. The first time delay circuit 441 has its input coupled to the output node and its output coupled to the input of the second time delay circuit 442. The output of the second time delay circuit 442 is coupled to the input of the third time delay circuit 443.

The circuitry 420 also includes first second and third NAND gates 445 through 447, the outputs of which provide respective control signals recycle 336, evaluation 315, and zero capacitor 335 applied to respective gates 436, 415, and 435. The output node 414 is also coupled to first inputs of a NAND gate 445 and a NAND gate 446. A second input of NAND gate 445 is coupled to the output of time delay circuit 441. A second input of NAND gate 446 is coupled to the output of time delay circuit 443. A first input of NAND gate 447 is coupled to the output of time delay circuit 442. A second input of NAND gate 447 is coupled to the output of time delay circuit 443.

These signals, which correspond to the signals as shown in the timing diagram of FIG. 3 to self-control the evaluation and precharge timing, including charge recycling. In particular, as soon as an evaluation occurs by which a particular combination of input signals pulls down the dynamic node 450 through the input circuitry 422 and the output node 414 is correspondingly driven up, the output signal going high on the output node 414 ends the evaluation phase, by triggering the evaluation signal output by the second NAND gate 446 to be de asserted, and begins the precharge phase, by triggering the recycle signal output by the first NAND gate 445 to be deasserted, which turns on the PFET 433 and begins transferring charge from the capacitor 430 to the dynamic node 450. A short while later, the output of the first delay circuit 441 is deasserted responsive to the output signal going high, which causes the recycle signal to be reasserted turning off the PFET 433. Then a short while later, the output of the second delay circuit 442 is asserted responsive to the output of the first delay circuit 441 being de asserted. This causes the reset signal output by the third NAND gate 447 to be de asserted, which turns on PFET 401 to finish charging the dynamic node 450. Rst_b 316 is inverted to generate zeroC signal 335 for fully discharging the charge recovery capacitor 430. Then a short while later, the output of the third delay circuit 443 is de-asserted responsive to the output of the second delay circuit 442 being asserted. As soon as the recycle and reset signals cause the dynamic node 450 to recharge, this pulls down the output node 414 again, which triggers assertion of the evaluation signal output by second NAND gate 446, beginning another evaluation phase.

Figure 5:
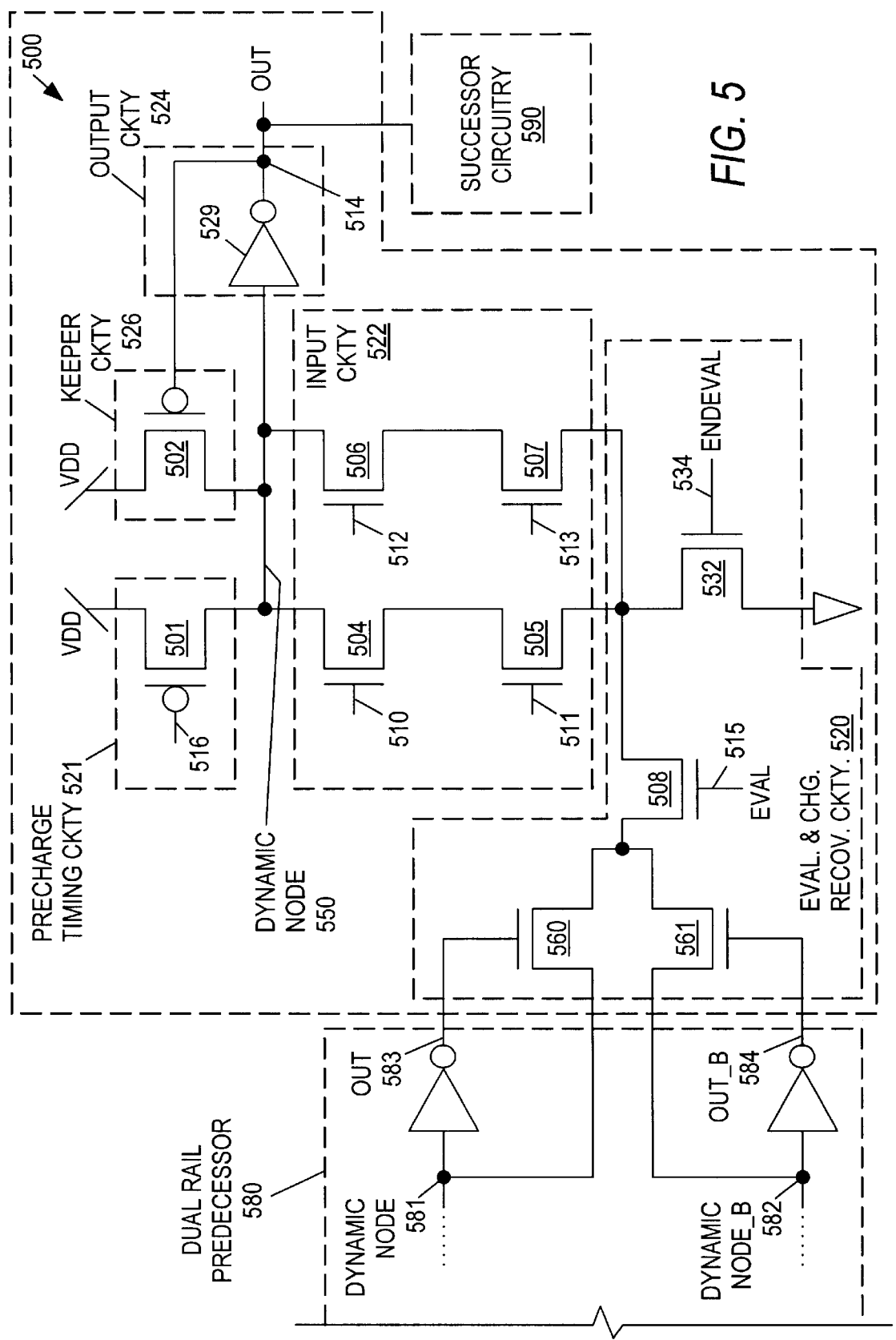
FIG. 5 illustrates a combination of two dynamic logic circuits for charge recovery, according to an embodiment of the invention.

Referring now to FIG. 5 an alternative embodiment is shown. In the arrangement of FIG. 5, charge is recovered by a combination of dynamic logic circuitry 500, preceding dynamic logic circuitry 580, and successor dynamic logic circuitry 590. That is, in the combination of FIG. 5, the dynamic logic circuits 500, 580 and 590 recover charge by transferring among their respective dynamic nodes. This is in contrast to the dynamic logic circuitry 200 of FIG. 2, in which a single dynamic logic circuit 200 with a discreet capacitor 230 for storing charge from the circuit's own dynamic node 250 during evaluation and transferring the charge back to the dynamic node 250 during precharge.

Identity and operation of circuitry and elements in the dynamic logic circuitry 500 correspond to that of similarly numbered circuitry and elements of the dynamic logic circuitry 200 of FIG. 2. For example, PFET 201 of FIG. 2 corresponds to PFET 501 of FIG. 5. Therefore, the following description will focus only on those elements and operations in FIG. 5 which differ from those in FIG. 2.

Since predecessor dynamic circuitry 580 is dual rail, during an evaluation interval either its output, out 583, or its complementary output, out_b 584, will be high (and the corresponding dynamic node 581 or 582 will be low). If out 583 is high, this will turn on pass gate 560. If, on the other hand, out_b is high, this will turn on pass gate 561. During the evaluation phase of dynamic circuitry 500, charge from the dynamic node 550 needs to be sunk. If out 583 is high, the corresponding dynamic node 581 will be low, and charge from the dynamic node 550 will be sunk to dynamic node 581 when NFET 508 is turned on. If out_b 584 is high, the corresponding dynamic node 582 will be low, and charge from the dynamic node 550 can be sunk to dynamic node 582 when NFET 508 is turned on. This transfer of charge from dynamic node 550 to either dynamic node 581 or 582 initiates the precharge of 581 or 582.

During the precharge phase of dynamic circuitry 500, charge from the dynamic node 550 needs to be restored. This restoring of charge for dynamic circuitry 500 occurs at least partly by transfer of charge from a dynamic node of successor dynamic circuitry 590, just as described above for dynamic circuitry 500 transferring charge to its predecessor circuitry 580.

The description of the present embodiment has been presented for purposes of illustration, but is not intended to be exhaustive or to limit the invention to the form disclosed. Many additional aspects, modifications and variations are also contemplated and are intended to be encompassed within the scope of the following claims. For example, charge recycling PFET's 233 and 433 may be replaced by NFET's with a corresponding change in polarity of the control signals driving their gates.

What is claimed is:

1. Dynamic circuitry comprising:
   a dynamic node;
   precharge circuitry coupled to the dynamic node and to a voltage source for charging the dynamic node during a precharge interval responsive to a precharge signal;
   input circuitry coupled to the dynamic node for selectively discharging the dynamic node during an evaluation interval responsive to one or more input signals; and
   charge recovery circuitry coupled to the dynamic node for selectively recycling charge to the dynamic circuitry, wherein the charge recovery circuitry comprises a capacitor and circuitry for controlling transfer of charge from the dynamic node to the capacitor during the evaluation time interval and from the capacitor back to the dynamic node during the precharge interval.

2. The dynamic circuitry of claim 1, wherein the circuitry for controlling transfer of charge comprises a first transistor interposed between the input circuitry and the capacitor, and wherein the dynamic circuitry is operable to discharge the dynamic node through the first transistor to the capacitor during the evaluation interval.

3. The dynamic circuitry of claim 2, wherein the circuitry for controlling transfer of charge comprises a second transistor interposed between the dynamic node and the capacitor and a third transistor interposed between an anode of the capacitor and ground, and wherein the dynamic circuitry is operable to charge the dynamic node from the capacitor through the second transistor during a first portion of the precharge interval and discharge the capacitor to ground from the anode through the third transistor during a second portion of the precharge interval.

4. The dynamic circuitry of claim 3, wherein the dynamic circuitry is operable to turn off the second transistor so that the capacitor is isolated from the dynamic node before the discharging the capacitor to ground from the anode through the third capacitor during the second portion of the precharge interval.

5. The dynamic circuitry of claim 2, wherein the circuitry for controlling transfer of charge comprises a fourth transistor interposed between the input circuitry and ground, wherein the dynamic circuitry is operable to discharge the dynamic node through the first transistor to the capacitor during a first portion of the evaluation interval and discharge the dynamic node through the fourth transistor to ground during a second portion of the evaluation interval.

6. The dynamic circuitry of claim 5, wherein the circuitry is operable to turn off the first transistor so that the capacitor is isolated from the dynamic node before the discharging of the dynamic node through the fourth transistor to ground during the second portion of the evaluation interval.

7. The dynamic circuitry of claim 1, wherein the dynamic circuitry is first dynamic circuitry and the charge recovery circuitry is operable to be coupled to a dynamic node of dynamic circuitry, and wherein the charge recovery circuitry comprises circuitry for controlling transfer of charge from the dynamic node of the first dynamic circuitry to the dynamic node of the predecessor dynamic circuitry during the first dynamic circuitry evaluation interval.

8. The dynamic circuitry of claim 7, wherein the circuitry for controlling transfer of charge comprises a first transistor interposed between the input circuitry and the dynamic node of the predecessor dynamic circuitry, wherein the circuitry is operable to discharge the dynamic node through the first transistor to the dynamic node of the predecessor dynamic circuitry during the evaluation interval of the first dynamic circuitry.

9. The dynamic circuitry of claim 8, wherein the dynamic circuitry is operable to for the discharging of the dynamic node of the first dynamic circuitry through the first transistor to the dynamic node of second dynamic circuitry to occur during a first portion of the evaluation interval, and wherein the circuitry for controlling transfer of charge comprises a second transistor interposed between the input circuitry and ground, the dynamic circuitry being operable to discharge the dynamic node of the first dynamic circuitry through the second transistor to ground during a second portion of the evaluation interval.

10. The dynamic circuitry of claim 9, wherein the dynamic circuitry is operable to turn off the first transistor so that the capacitor is isolated from the dynamic node of the first dynamic circuitry before the discharging of the dynamic node of the first dynamic circuitry through the second transistor to ground during the second portion of the evaluation interval.

11. A method for charge recovery in dynamic circuitry, the method comprising the steps of:

a) discharging a dynamic node during an evaluation interval by input circuitry coupled to the dynamic node responsive to one or more input signals, wherein the discharging includes transferring charge from the dynamic node to a capacitor during the evaluation interval; and b) charging the dynamic node during a precharge interval by precharge circuitry responsive to a precharge signal, the precharge circuitry being coupled to the dynamic node and a voltage source, wherein the charging of the dynamic node includes transferring charge from the capacitor back to the dynamic node during the precharge interval, wherein the dynamic circuitry comprises circuitry for controlling transfer of charge having a first transistor interposed between the input circuitry and the capacitor, and wherein step a) comprises the step of discharging the dynamic node through the first transistor to the capacitor during the evaluation interval.

12. The method of claim 11, wherein the circuitry for controlling transfer of charge comprises a second transistor interposed between the dynamic node and the capacitor and a third transistor interposed between an anode of the capacitor and ground, and wherein step b) comprises the steps of:

charging the dynamic node from the capacitor through the second transistor during a first portion of the precharge interval; and discharging the capacitor to ground from the anode through the third transistor during a second portion of the precharge interval.

13. The method of claim 12, comprising the step of turning off the second transistor so that the capacitor is isolated from the dynamic node before the discharging of the capacitor to ground from the anode through the third transistor during the second portion of the precharge interval.

14. The method of claim 11, wherein the circuitry for controlling transfer of charge comprises a fourth transistor interposed between the input circuitry and ground, and wherein the step of discharging the dynamic node through the first transistor to the capacitor occurs during a first portion of the evaluation interval, and wherein step a) comprises the step of discharging the dynamic node through the fourth transistor to ground during a second portion of the evaluation interval.

15. The method of claim 14, comprising the step of turning off the first transistor so that the capacitor is isolated from the dynamic node before discharging of the dynamic node through the fourth transistor to ground during the second portion of the evaluation interval.

16. A method for charge recovery dynamic circuitry, the method comprising the steps of: a) discharging a dynamic node of first dynamic circuitry by input circuitry for the dynamic circuitry, wherein the discharging includes transferring charge from the dynamic node to a dynamic node of predecessor dynamic circuitry during an evaluation interval of the first dynamic circuitry; and charging the dynamic node of the first dynamic circuitry during a precharge interval of the first dynamic circuitry, wherein the charging includes transferring charge from a dynamic node of successor dynamic circuitry to the dynamic node of the first dynamic circuitry during the precharge interval for the first dynamic circuitry.

17. The method of claim 16, wherein the first dynamic circuitry comprises circuitry for controlling transfer of charge having a first transistor interposed between the input circuitry and the dynamic node of the predecessor dynamic circuitry, and wherein step a) comprises the step of discharging the dynamic node of the first dynamic circuitry through the first transistor to the dynamic node of the predecessor dynamic circuitry during the evaluation interval of the first dynamic circuitry.

18. The method of claim 17, wherein the circuitry for controlling transfer of charge comprises a second transistor interposed between the input circuitry and ground, and wherein the step of discharging the dynamic node of the first dynamic circuitry through the first transistor to the dynamic node of the predecessor dynamic circuitry occurs during a first portion of the evaluation interval of the first dynamic circuitry, and wherein step a) comprises the step of discharging the dynamic node of the first dynamic circuitry through the second transistor to ground during a second portion of the evaluation interval.

* * * * *